United States Patent
Krupyshev et al.

(10) Patent No.: US 10,418,261 B2
(45) Date of Patent: Sep. 17, 2019

(54) WORKPIECE HANDLING MODULES

(71) Applicant: Brooks Automation, Inc., Chelmsford, MA (US)

(72) Inventors: Alexander G. Krupyshev, Chelmsford, MA (US); John Underwood, Chelmsford, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 363 days.

(21) Appl. No.: 15/137,722

(22) Filed: Apr. 25, 2016

(65) Prior Publication Data

US 2016/0314993 A1 Oct. 27, 2016

Related U.S. Application Data

(62) Division of application No. 13/334,181, filed on Dec. 22, 2011, now Pat. No. 9,324,594.

(60) Provisional application No. 61/426,138, filed on Dec. 22, 2010.

(51) Int. Cl.
*H01L 21/677* (2006.01)
*H01L 21/67* (2006.01)

(52) U.S. Cl.
CPC ........ *H01L 21/677* (2013.01); *H01L 21/6719* (2013.01); *H01L 21/67126* (2013.01); *H01L 21/67196* (2013.01); *H01L 21/67201* (2013.01)

(58) Field of Classification Search
CPC ........... H01L 21/6719; H01L 21/67196; H01L 21/67201
See application file for complete search history.

(56) References Cited

U.S. PATENT DOCUMENTS

| | | |
|---|---|---|
| 5,794,299 A | 8/1998 | Gockel et al. |
| 6,776,848 B2 | 8/2004 | Rosenstein et al. |
| 6,866,746 B2 | 3/2005 | Lei et al. |
| 8,025,269 B1 | 9/2011 | Sarver |
| 2003/0172872 A1 | 9/2003 | Thakur et al. |
| 2003/0221780 A1 | 12/2003 | Lei et al. |
| 2004/0185670 A1 | 9/2004 | Hamelin et al. |
| 2005/0139160 A1 | 6/2005 | Lei et al. |
| 2006/0071384 A1 | 4/2006 | Lee et al. |

(Continued)

FOREIGN PATENT DOCUMENTS

JP 2010283090 12/2010

OTHER PUBLICATIONS

International Search Report, International Application No. PCT/US2011/066707, dated May 3, 2012.

*Primary Examiner* — Jonathan Snelting
(74) *Attorney, Agent, or Firm* — Perman & Green, LLP; Colin C. Durham

(57) ABSTRACT

A workpiece handling module including a first housing member and a second housing member pivotally movable relative to the first member forming a housing having an access side and a second side opposite the access side and side walls, a first portion of the side walls is carried by the first member and a second portion of the side walls is carried by the second member, and at least one of the first and second housing members includes at least one sealable opening for allowing ingress and egress of workpieces to and from an interior chamber formed by the first and second housing members in a closed configuration, and the second portion of the side walls adjacent the access side and carried by the second member is greater than the first portion of the side walls adjacent the access side and carried by the first member.

21 Claims, 10 Drawing Sheets

(56) References Cited

U.S. PATENT DOCUMENTS

| | | |
|---|---|---|
| 2006/0134919 A1 | 6/2006 | Hamelin et al. |
| 2007/0031236 A1 | 2/2007 | Chen |
| 2007/0095285 A1 | 5/2007 | Thakur et al. |
| 2009/0047433 A1 | 2/2009 | Kim et al. |
| 2009/0056626 A1 | 3/2009 | Thakur et al. |
| 2009/0078200 A1 | 3/2009 | Lee et al. |
| 2009/0078373 A1 | 3/2009 | Lee et al. |
| 2009/0084316 A1 | 4/2009 | Lee et al. |
| 2012/0087766 A1 | 4/2012 | Hiroki |

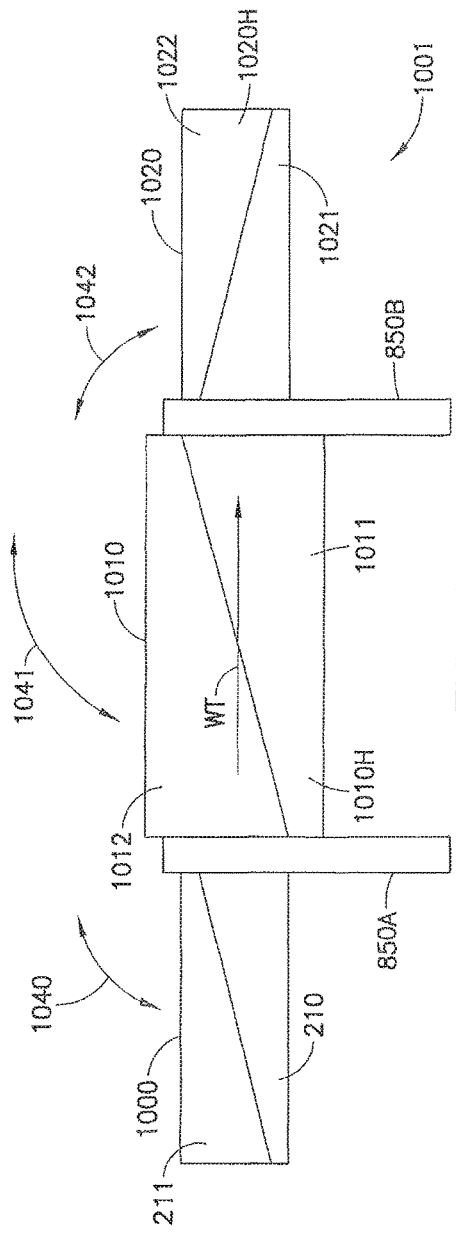
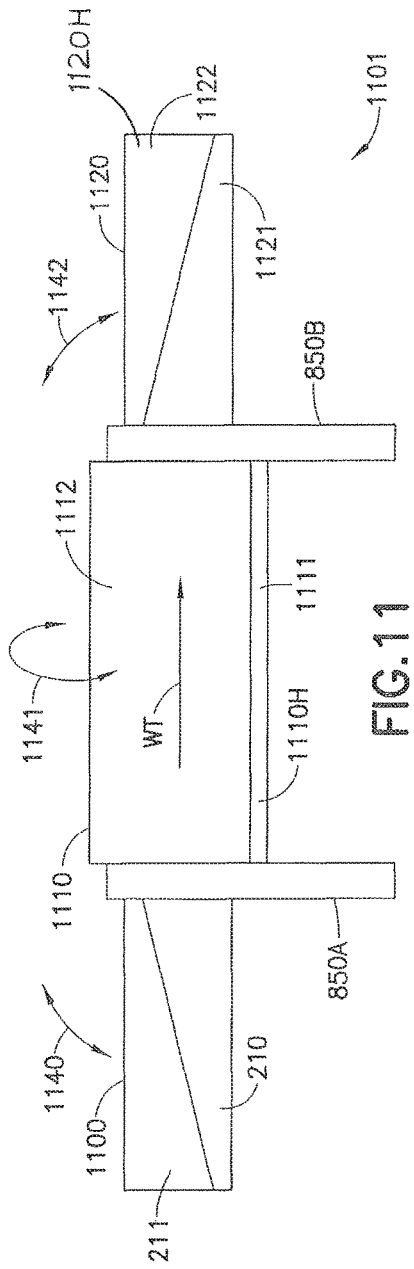

WORKPIECE HANDLING MODULES

CROSS-REFERENCE TO RELATED APPLICATIONS

This application is a divisional of U.S. patent application Ser. No. 13/334,181 filed on Dec. 22, 2011 (now U.S. Pat. No. 9,324,594 issued on Apr. 26, 2016) which is a non-provisional of and claims the benefit of U.S. Provisional Patent Application No. 61/426,138 filed on Dec. 22, 2010, the disclosures of which are incorporated herein by reference in their entireties.

BACKGROUND

1. Field

The aspects of the disclosed embodiment generally relate to substrate processing systems and, more particularly, to accessing internal areas of the substrate processing system.

2. Brief Description of Related Developments

Generally, conventional load locks, for example, in substrate processing systems have a housing that forms an internal chamber. This internal chamber may house substrates being processed within the substrate processing system. Generally, access is provided to this internal chamber through a manually operated or automatically operated atmospheric door and/or a flat removable lid on the top surface of the load lock. Access to the internal chamber through these conventional atmospheric doors or lids is substantially limited and may require sliding or lifting mechanisms to allow for an exchange of the substrates or other suitable payload within the internal chamber.

It would be advantageous to provide a load lock or other suitable processing tool with substantially unhindered access for exchanging a payload or substrate located within an internal chamber of the load lock or processing tool without additional mechanical devices such as sliding (e.g. drawers) or lifting mechanisms that move the workpieces substantially in and out of the load lock or other workpiece handling module.

BRIEF DESCRIPTION OF THE DRAWINGS

The foregoing aspects and other features of the disclosed embodiment are explained in the following description, taken in connection with the accompanying drawings, wherein:

FIGS. 2A-6B are schematic illustrations of process modules in accordance with aspects of the disclosed embodiment;

FIG. 10 schematically illustrates a process tool in accordance with aspects of the disclosed embodiment; and FIG. 11 schematically illustrates a process tool in accordance with aspects of the disclosed embodiment.

DETAILED DESCRIPTION OF THE EXEMPLARY EMBODIMENT(S)

Figure 1:
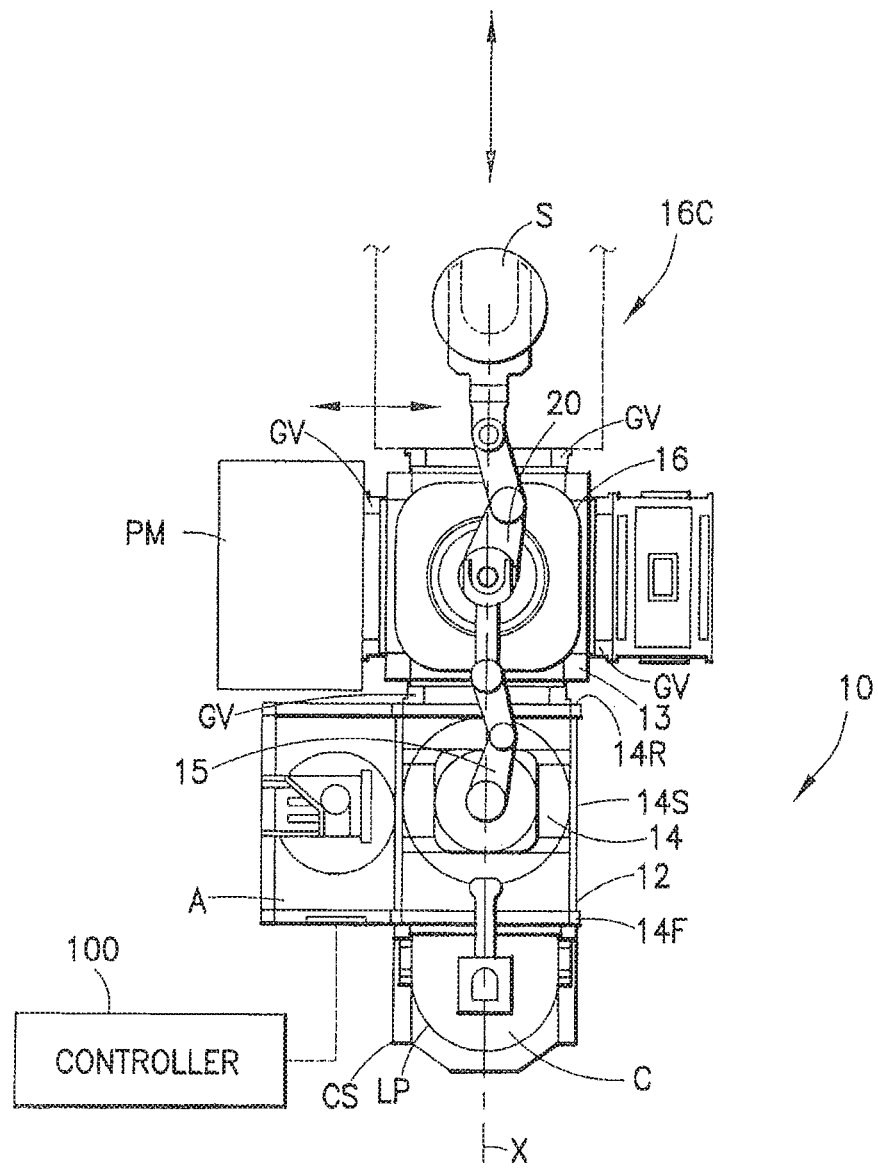
FIG. 1 is a portion of an exemplary substrate processing system incorporating aspects of the disclosed embodiment.

FIG. 1 illustrates an exemplary workpiece processing system 10 in accordance with aspects of the disclosed embodiment. Although the aspects of the disclosed embodiment will be described with reference to the drawings, it should be understood that the aspects of the disclosed embodiments can be embodied in many alternate forms. In addition, any suitable size, shape or type of elements or materials could be used.

The workpiece processing system 10, or tool, generally has a processing section 13 and an interface section 12. The interface sections 12 and processing section 13 of the tool 10 are connected to each other and allow transport of workpieces in between. The workpieces S illustrated in the figures are exemplary only and may be for example 450 mm, 300 mm, or 200 mm wafers, reticles, mask, flat panels for displays, solar panels or any other desired workpiece item for manufacturing such as, for example, any suitable semiconductor device such as e.g. light emitting diodes or microchips. It should be understood that the aspects of the disclosed embodiment can be applied to the processing of any suitable workpieces, semiconductor or otherwise.

The processing section 13 of the tool may have processing modules or chambers PM, such as material deposition modules (CVD, PVD, copper implantation, epitaxial silicon, dielectric deposition, rapid thermal processing, ion implantation, etching, chemical mechanical polishing, metrology, electroplating, etc.) or any other suitable processing modules for processing the workpieces S in accordance with a desired processing protocol. The processing modules PM may be linked by a workpiece transport chamber module 16 in which the workpieces may be transported between desired processing modules according to the processing protocol. The transport chamber module 16 may include a transport robot 20 (or any other suitable transport device) capable of moving the workpieces therein and to the process modules PM. The process modules PM and the transport chamber module 16 are capable of being atmospherically sealed or isolated from the exterior atmosphere in order to maintain an atmosphere within the transport chamber substantially the same as the processing modules, or any other atmosphere suitable for workpieces being transferred between processing modules. For example, the transport chamber may have an inert gas (e.g. $N_2$) atmosphere or may hold a vacuum (or near vacuum atmosphere). The tool interface section 12 provides a workpiece loading/unloading interface between the tool processing section 13 and its isolatable atmosphere and the tool exterior. The tool interface section 12 thus allows workpieces, that may be transported in carriers outside the tool, to be unloaded from the carrier into the tool and vice versa.

The transport chamber module 16 may be configured to connect to other transport chamber modules in any suitable manner. For example, the transport chamber modules 16 may be connected end to end for example to form a linearly elongated transport chamber 16C. The transport chamber 16C length is thus variable by adding or removing transport chamber modules 16. It is noted, however, that while the aspects of the disclosed embodiment are described herein with reference to linearly arranged process tool 10, the aspects of the disclosed embodiment can be applied equally to any suitable process tool where an operator may desire to access workpieces within the processing tool including but not limited to cluster tools that, for example, include a central chamber having processing modules attached to one or more sides of the central chamber to form a clustered arrangement.

The transport chamber modules 16 may have entry/exit gate valves GV capable of sealing or isolating desired transport chamber modules from adjoining portions of the transport chamber 16C, process modules PM and/or interface sections 12. Tool interface sections similar to section 12 may be positioned at any desired locations along the linearly elongated transport chamber 16C allowing workpieces S to be loaded or unloaded at a desired location (e.g. at the ends of the linearly arranged tool or at a point between the ends) in the tool 10. Processing modules PM may be distributed along the length of the transport chamber 16C. The processing modules PM may be stacked in a direction angled to the length of the chamber. The transport chamber modules 16 may have entry/exit gate valves GV to isolate desired transport chamber modules 16 from the processing modules PM, other transport chamber modules 16 and/or interface sections 12.

A transport system may be distributed throughout the transport chamber 16C. A number of the transport chamber modules 16 may each have an integral movable arm (substantially similar to robot 20) having a fixed interface/mount to the module and movable end effector capable of holding and moving workpieces linearly along the transport chamber 16C and between transport chamber 16, process modules PM and/or interface sections 12. Transport arms in different transport chamber modules may cooperate to form at least a portion of the linearly distributed transport system. In other aspects the transport system may include one or more carts configured to transport workpieces along the transport chamber 16C. Operation of the transport system, processing modules, processing section, interface section and any other portions of the tool may be controlled by controller 100. Controller 100, depicted schematically in FIG. 1, may have a distributed or clustered control architecture, a suitable example of which is described and shown in U.S. application Ser. No. 11/178,615, filed Jul. 11, 2005 incorporated by reference herein in its entirety. The transport chamber 16C and transport system therein may be arranged to define multiple workpiece travel lanes within the transport chamber as will be described in greater detail below. The travel lanes may be polarized or dedicated within the transport chamber 16C for advance and return of workpieces. The transport chamber 16C may also have intermediate load locks 18 allowing different sections of the transport chamber 16C to hold different atmospheres, and allow workpieces to transit between the different atmospheric sections of the transport chamber 16C.

It is noted that the interface sections 12 may serve as entry exit station(s) of the transport chamber 16C and may communicate with each other through a workpiece express transit passage that allows workpieces to transit between interface sections 12 substantially without travelling through the transport chamber 16C. The express transit passage may be independent of and isolatable from the transport chamber 16C. Workpieces, may be rapidly placed into an advanced section of the tool and returned to the interface section 12 after processing via the express transit passage, without affecting the transport chamber 16C, and resulting in a reduction of work in process (WIP). The transport chamber may also have intermediate entry/exit interface stations 12, a number of which may communicate with the express transit passage so that workpieces may be transported therebetween. This allows workpieces to be inserted or removed at desired intermediate portions of the process without affecting the process stream of the tool 10.

Referring still to FIG. 1, the interface section 12 is shown for example purposes at an end of the transport chamber 16C of the tool 10, but may be located as desired including for example at an intermediate location along the transport chamber, between the ends of the transport chamber. Though FIG. 1 shows a tool 10 with one interface section 12 connected to the transport chamber 16C it should be understood that the tool 10 may have any desired number of interface sections connected to the transport chamber 16C. The interface section 12 has an exemplary configuration and may have any desired configuration/arrangement. The interface section 12 generally has a closure or chamber 14 and a load port(s) LP (one is shown for example purposes only and the chamber may have any desired number of load ports). The chamber is communicably connected with the transport chamber 16C so that workpieces may be transported between interface section chamber 14 and transport chamber 16C. The chamber 14 of the interface section may be an environmental module, with a controlled air system for example having fan(s) and particulate filter(s) to maintain desired cleanliness conditions within chamber 14. The interface section chamber 14 may be referred to as the environmental chamber. The load port LP provides a controlled port (not shown) through which workpieces may be loaded and unloaded from the chamber 14 of the interface section without compromise of the controlled environmental conditions and environment inside the environmental chamber 14. A load lock (not shown in FIG. 1, but see FIGS. 2-7B) may be provided to transition between environmental chamber 14 and transport chamber 16C. An example of a suitable environmental interface section is disclosed in U.S. patent application Ser. No. 11/178,836, filed Jul. 11, 2005 incorporated by reference herein in its entirety. A controlled port of the load port provides an opening into the interface section through which workpieces are transported into and out of the interface section, and hence, into and out of the tool 10. The controlled port opening may have a door or closure (not shown) closing, or at least partially blocking the opening, to maintain the controlled environment in the interface section 12 when workpieces are not being loaded/unloaded from the interface section. The port door is closed when workpieces are not being loaded/unloaded. In the embodiment shown, the workpieces may be transported outside the tool inside carriers or containers such as FOUP(S), SMIF(s) or other suitable workpiece containers. FIG. 1 shows a FOUP C mated to the load port LP but it should be understood that the load port LP may be arranged to mate with any desired carrier. As may be realized from FIG. 1, when the workpiece container C is mated to the load port LP, the container may be sealed to the controlled port of the load port LP, so that the port door may be opened. With the port sealed by the container, the port door, and the closure (not shown) of the container C (closing the container opening through which workpieces are loaded into the container) may be removed, for example simultaneously without exposure of potentially contaminated closure surfaces to the chamber interior, thereby opening the container C to the environmental chamber 14. The environmental chamber 14 is connected to transport chamber 16C at chamber face 14R, and the load port LP is located on the opposite chamber face 14F. It is noted that transport chamber 16C may also be connected to the environmental chamber through a side faces 14S of the load port LP. The load port LP may have a container support CS for supporting container(s) mated to the load port. The container support CS may extend from chamber face 14F, and the transport chamber 16C, environmental chamber 14 and load port LP are arranged substantially in line along axis X for example purposes. It should be understood, however, that the transport chamber 16C, environmental chamber 14 and load port LP may not be aligned. For example, the load port (and its container support) may be located on a face of the environmental chamber, such as side face 14S) that positions the load port transverse or angled to the alignment axis of the interface section 12 and transport chamber 16C. As may be realized, the container support CS may be positioned to allow container interface with a suitable automated container transport system (not shown), such as an overhead or floor mounted automated material handling system (AMHS), a conveyor system or autonomous or rail guided vehicles. Containers may also be loaded manually on the load port container support. The workpiece containers may be reduced WIP containers suitable examples of which are described and shown in U.S. patent application Ser. No. 11/207,231, filed Aug. 19, 2005, incorporated by reference herein in its entirety. The load port door and container closure may be passive, (i.e. passive locking features without movable features), suitable examples of which are described and shown in U.S. Patent Application titled "Reduced Capacity Carrier, Transport, Load Port, Buffer System", filed Nov. 3, 2005. Where the port door of the load port is passive, the interface section chamber 14 may be for example connected to suitable environmental control systems (e.g. suction source/roughing pump, vent to atmosphere, vent to transport chamber) to allow the interface section to operate as a load lock (i.e. capable of transition between the atmosphere inside the transport chamber 16C and that of the workpiece container C). As shown in FIG. 1, the interface section 12 mates directly to the transport chamber without any intervening load locks, but it should be understood that a load lock may be placed between the interface section 12 and the transport chamber 16C for connecting the two together and allowing transfer of workpieces between the interface section 12 and transport chamber 16C.

The interface section may have a workpiece transport 15 (similar to transport robot 20) for moving workpieces from the container C mated to the load port, to the transport chamber 16C. The transport 15 is located inside the interface section chamber 14, and may have for example multiple independently movable end effectors for independently moving multiple workpieces. The transport 15 is illustrated for example as a multi-articulated link arm, that may have three (3), four (4), five (5) or six (6) degrees of freedom (for example two independently movable end effectors (θ, r) and combined Z motion). It should be understood that the interface section 12 may be provided with any suitable workpiece transport apparatus. The interface section 12 may also include workpiece station(s) A such as an aligner station, buffer station, metrology station and/or any other desired handling station for workpiece(s) S.

Figure 2:
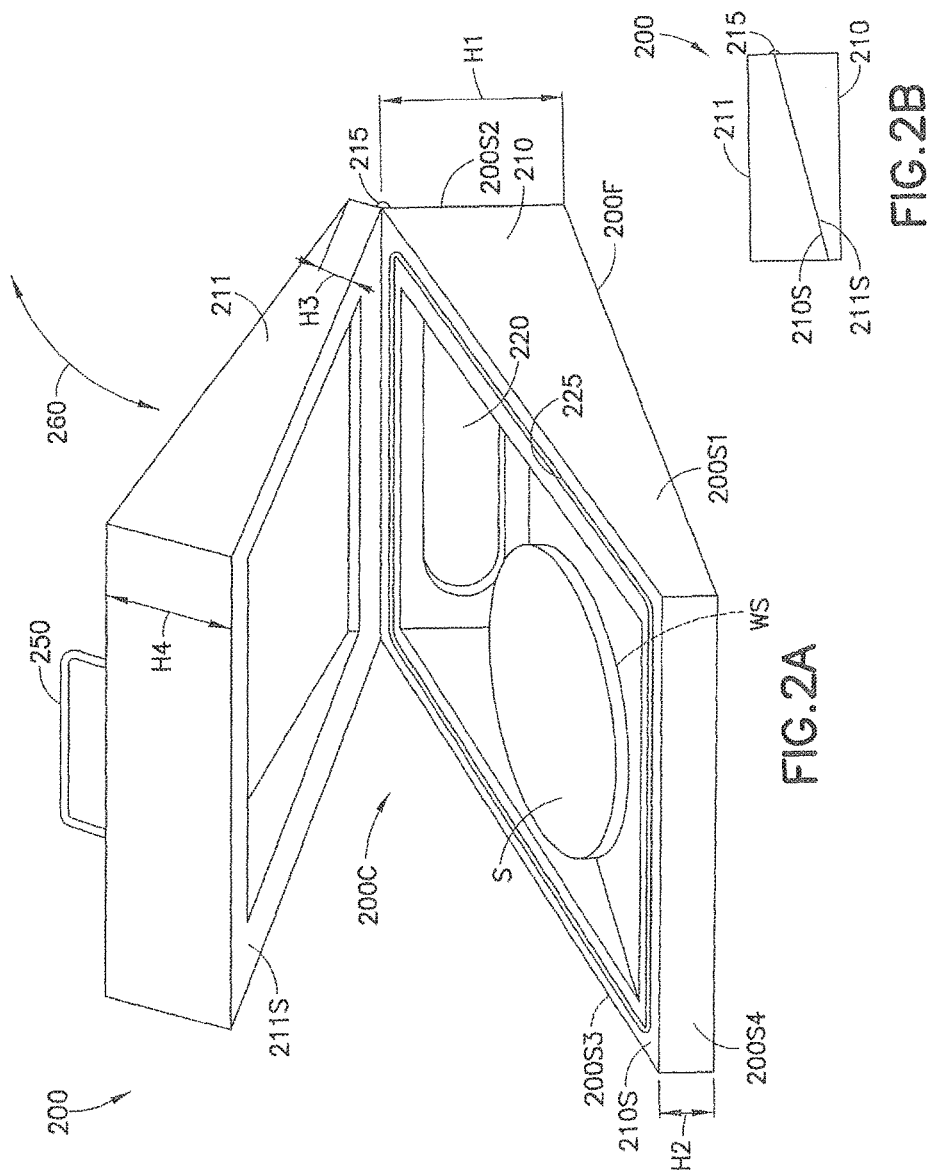
Figure 3:
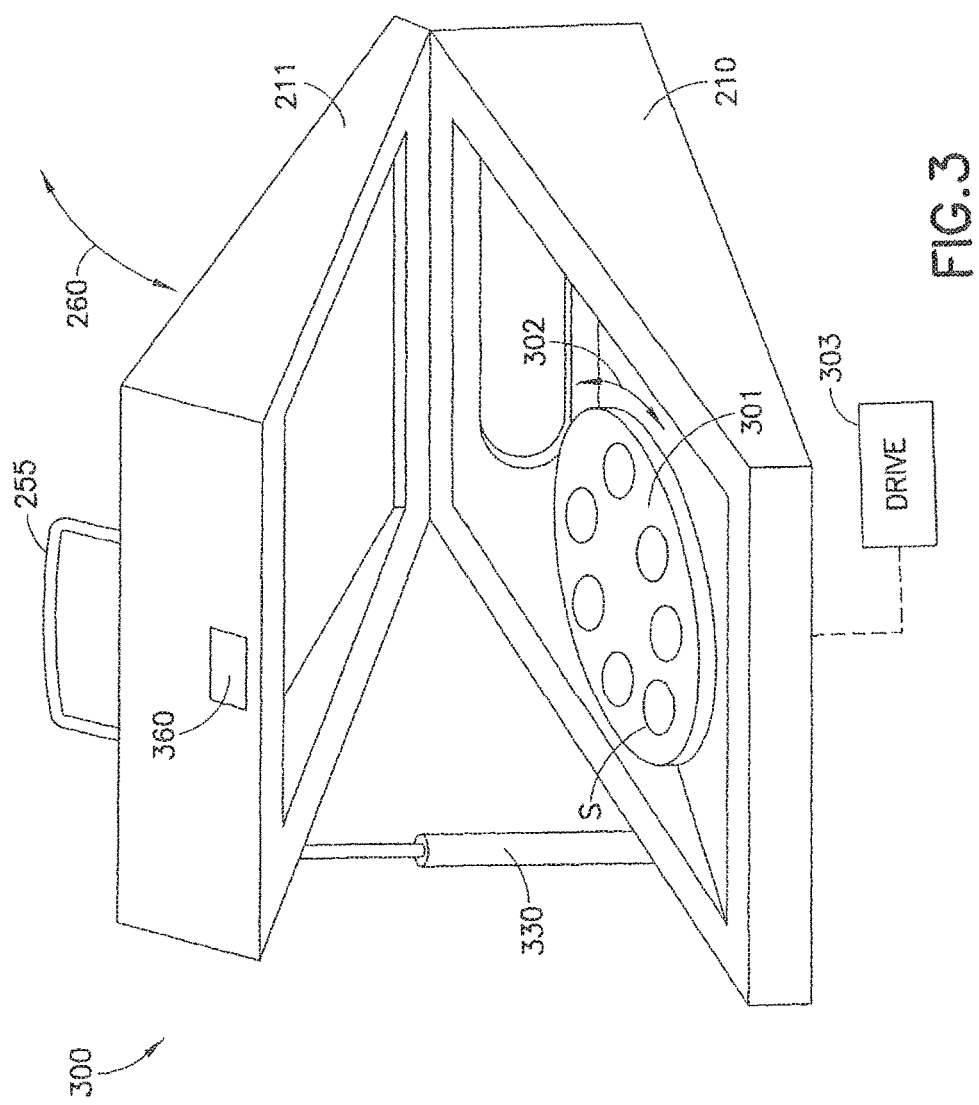

Referring now to FIGS. 2A, 2B and 3, a load lock 200, 300 is shown in accordance with the disclosed embodiment. The load lock 200, 300 may allow the manual loading and unloading of the load lock (or loading of the load lock with a transport robot where the load lock includes more than one loading port as will be described below). It is noted that the load locks 200, 300 of FIGS. 2A, 2B and 3 are substantially similar to each other (unless otherwise noted) such that like reference numerals correspond to like features. It should also be understood that while the aspects of the disclosed embodiment are described herein with respect to the load lock 200, 300, the aspects of the disclosed embodiment may also be applied equally to any portion of the processing system 10 including the transport chamber modules 16, process modules PM and the workpiece station(s) A. The load lock 200, 300 (or other suitable module 16, PM, A or portion thereof) may be configured to allow an operator to have substantially unimpeded access to, for example, the substrate(s) S within the load lock 200, 300. The load lock 200, 300 includes a frame 200F having a first member 210 and a second member 211. The first and second members 210, 211 may be movably joined to each other in any suitable manner such as through one or more hinges 215 or other pivotable/rotatable joint or coupling to form an internal chamber 200C of the load lock 200, 300. The first and second members 210, 211 of the load lock 200, 300 may have sides 200S1-200S4 for forming side walls of the chamber 200C (e.g. when the first and second members are in a closed configuration). As can be seen in the Figures, the load lock 200, 300 has a substantially "clam" shaped configuration such that the first member 210 and second member 211 are movable relative to one another such that three sides 200S1, 200S3, 200S4 of the first and second members substantially disengage each other, while the fourth side 200S2 remains substantially engaged for allowing the opening of the load lock 200, 300 and for allowing operator access to the contents of the load lock chamber 200C.

It is noted that in aspects of the disclosed embodiment the first member 210 forms a bottom portion of the load lock 200, 300 and the second member 211 forms a top portion of the load lock 200, 300. The first and second members 210, 211 may be configured such that when the top (e.g. second member 211) of the load lock is opened (e.g. moved relative to the first member 210) the profile of the first member's sides allows substantially unimpeded access to the workpiece S. For example, the side 200S2 of the first member 210, which is substantially hinged to the side 200S2 of the second member 211, may have a first height H1. The side 200S4 of the first member 210 may have a second height H2, where the first height H1 is substantially greater than the second height H2. Likewise, the side 200S2 of the second member may have a third height H3 and the side 200S4 of the second member 211 may have a fourth height H4 where the fourth height H4 is substantially greater than the third height H3. This difference in heights of the first and second members 210, 211 between opposing sides 200S2 and 200S4 (e.g. the difference in heights H1 and H2 and the difference in heights H3 and H4) provides a substantially inclined interface between the first and second members 210, 211 such that portions of the side walls 200S1, 200S3, 200S4 adjacent an access side (e.g. side 200S4) of the load lock that are carried by the second member 211 are greater than the portions of the walls 200S1, 200S3, 200S4 adjacent the access side (e.g. side 200S4) carried by the first member 210.

The first and second members 210, 211 may include sealing surfaces 210S, 211S that interface with each other for forming the substantially inclined interface and sealing the chamber 200C when the first and second members 210, 211 are in a closed configuration as shown in FIG. 2B. The sealing surfaces 210S, 211S may be configured in any suitable manner for forming a seal therebetween. For example, any suitable sealing member(s) 225 may be disposed on one or more of the surfaces 210S, 211S. The sealing member(s) 225 may include but is not limited to one or more of mechanical seals, o-rings, labyrinth seals or any other seal capable of maintaining a controlled environment and/or vacuum within the chamber 200C when the first and second members 210, 211 are in the closed configuration. As may be realized, the load locks 200, 300 may also have any suitable sensor(s) or combination of sensors for monitoring, for example, any suitable environmental conditions within the load lock 200, 300 (or transport chamber modules 16, process modules PM and the workpiece station(s) A) and/or a position or condition of items within the load lock 200, 300 (or transport chamber modules 16, process modules PM and the workpiece station(s) A). For example, the load lock 200, 300 may include suitable sensors for monitoring a pressure within the load lock 200, 300, a position or location of the workpiece (or robot) within the load lock 200, 300 and for inspecting characteristics of the workpiece.

One or more openings or ports 220 may be located on one or more of the sides 200S1-200S4 for allowing workpieces S to pass into and out of the load lock 200, 300. In FIGS. 2A-3 the load lock 200, 300 is shown as a manually loaded load lock (e.g. an operator opens the load lock for manually inserting and removing workpieces from the load lock) having one opening 220 on side 200S2 for illustrative purposes only, however, it should be understood (as will be described below) the aspects of the disclosed embodiment may be applied to other load locks as well. It should also be understood that the load locks may include automation for opening the load lock to allow loading of the lock with automated equipment. As may be realized, any suitable doors or valves 850 (850 FIGS. 7-9) may be connected to a respective side 200S1-200S4 of the load lock for selectively opening and closing the openings 220 for sealing an atmosphere of the chamber 200C from other atmospheres of the process tool 10, such as for example an atmosphere of the transport chamber 16C, interface section 12 and/or process modules PM. The load lock 200, 300 may also include any suitable workpiece support WS for supporting the workpiece S within the load lock 200, 300. In the case where a platter or susceptor 301 (FIG. 3) with multiple substrates S is located within the load lock 300, the load lock may include a rotatable drive 303 (FIG. 3) for allowing rotation of the platter or susceptor 301 in the direction of arrow 302 so that each substrate may be positioned closer to the operator when the load lock 200, 300 is in an open configuration.

The first and second members 210, 211 may be moved relative to each other in any suitable manner. A handle 250 may be provided on, for example, the second member 211 to allow moving the second member 211 in the direction of arrow 260 for opening the load lock 200. It should be understood that while a single handle is shown, the load lock 200 may include more than one handle located at any suitable location(s) on or integrally formed in or with, for example, the second member 211. Assistance for opening the load lock 200, 300 may also be provided in any suitable manner. For example, any number and combination of suitable lifting devices such as shocks 330 and torsion bars/springs (not shown) may be connected to the first and second members 210, 211. As shown in FIG. 3, the shock 330 is coupled on one end to the first member 210 and coupled on the other end to the second member 211 so that when, for example, a locking device 360 (that latches the first and second members in a closed configuration during operation of the process tool 10) is released the shock 330 (and/or torsion bar/spring) pushes the second member 211 in the direction of arrow 260 away from the first member 210 (e.g. with or without assistance from an operator). It is noted that the force provided by the shock(s) 330 and/or torsion bar/spring (or any other suitable opening assistance device(s)) may be balanced with a weight of the second member 260 so that the second member can be easily closed and opened by an operator of the processing tool 10. It is also noted that the opening assistance devices may by themselves be suitable to hold the second member 211 open but it should be understood that other suitable devices (such as retractable substantially rigid supports or locks) may be employed alone or in combination with the opening assistance devices for holding the second member 211 open. Powered lifting devices may also be provided for opening and closing the load lock. The powered lifting devices may be automated in any suitable manner for allow for loading of the load lock manual and/or with any suitable automated material handling transports.

Figure 4:
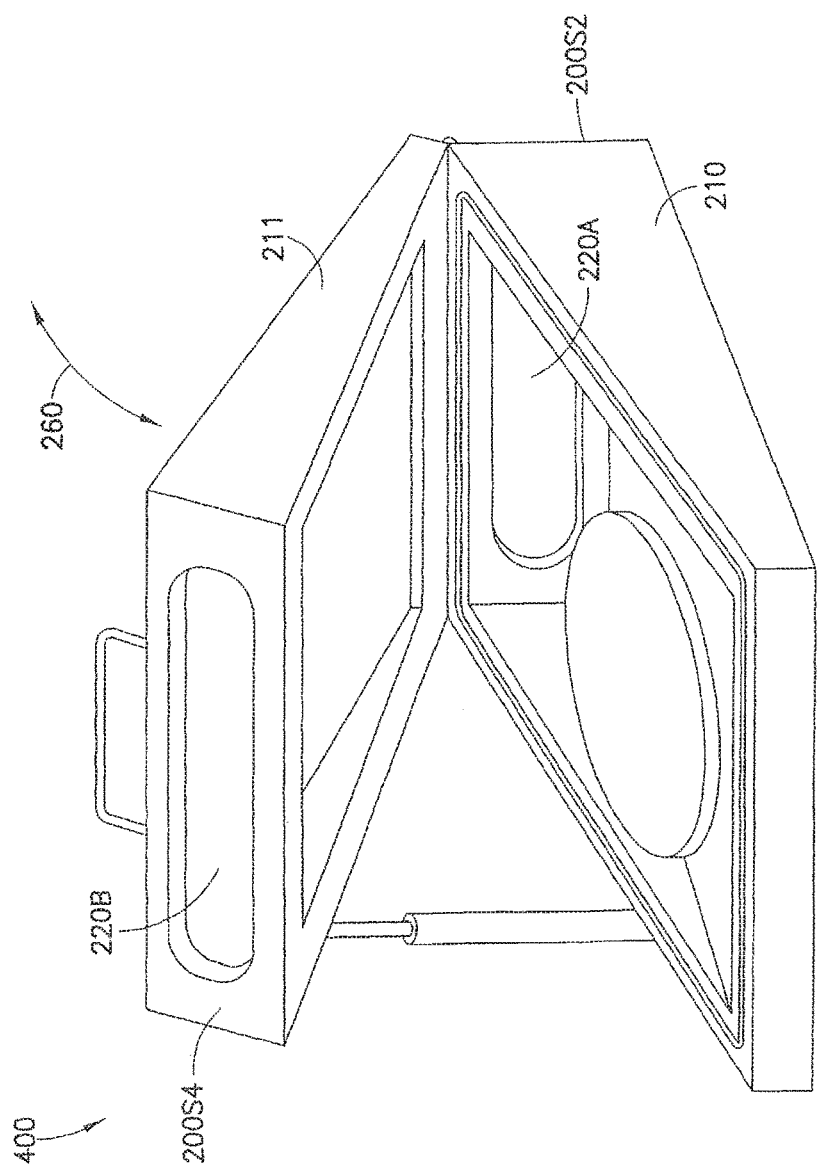
Figure 5:
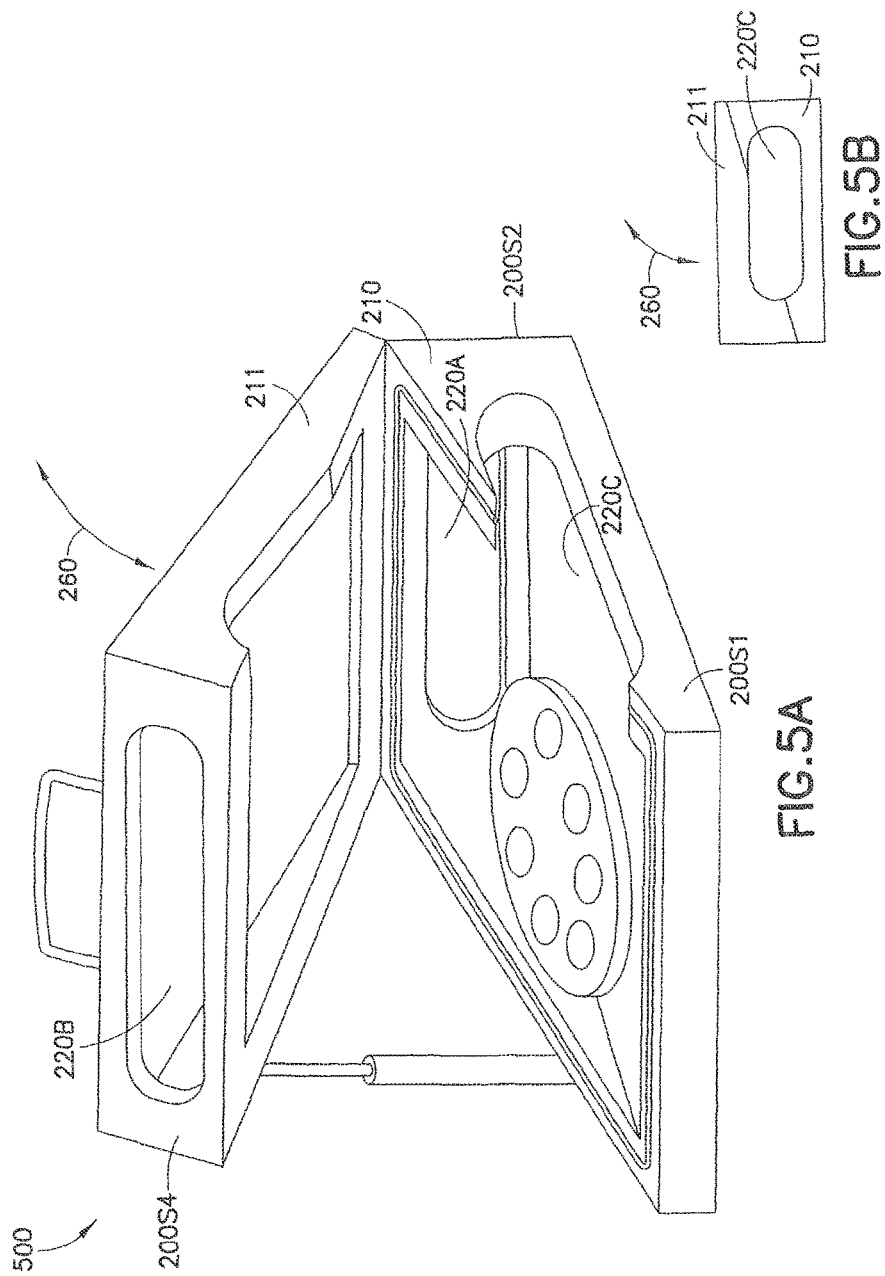
Figure 6:
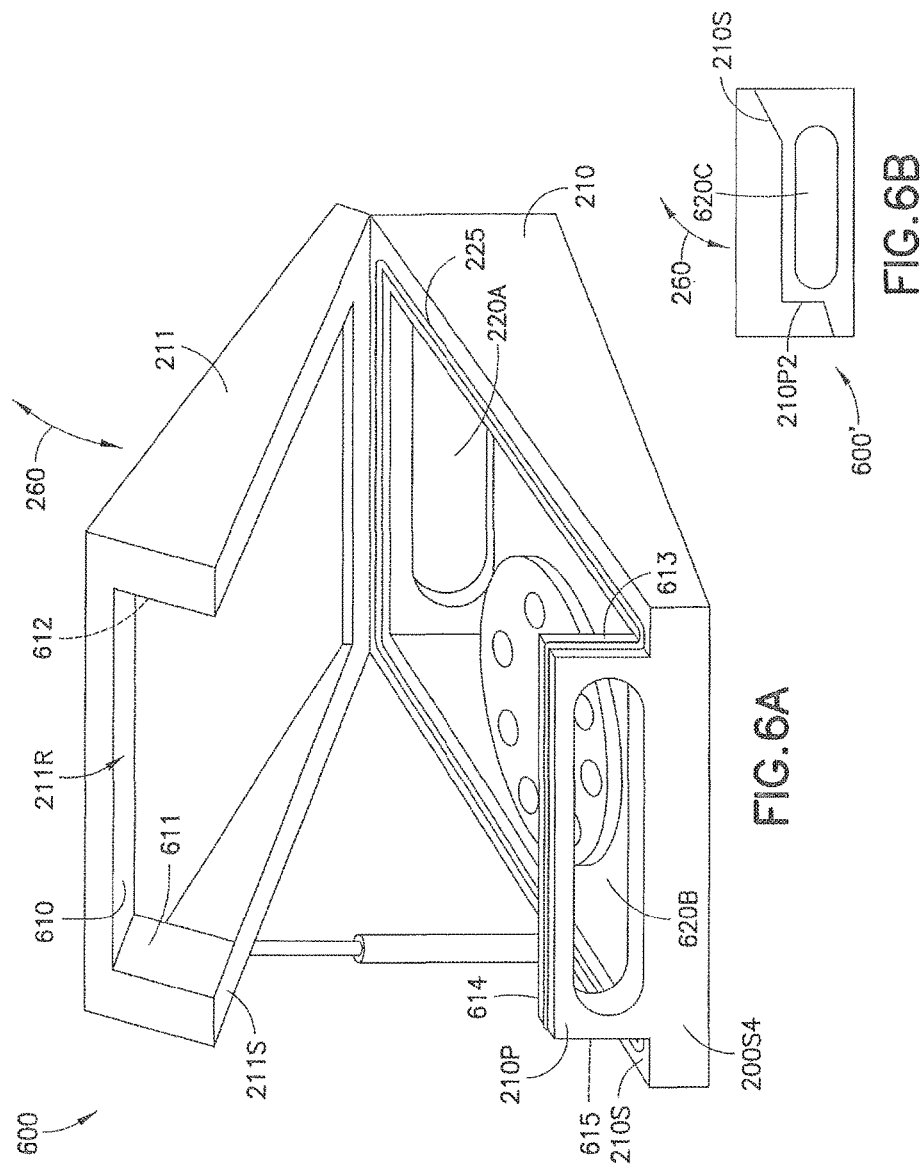

It is noted that while the aspects of the disclosed embodiment described with respect to FIGS. 2A-3 include only one opening or port 220, as noted above, the load lock may include more than one opening or port 220. Referring to FIG. 4, a load lock 400 (which may be substantially similar to load locks 200, 300) is shown as having a first opening 220A and a second opening 220B. The openings 220A, 220B may be substantially similar to opening 220 (FIGS. 2A and 3) and be located on opposite sides 200S2, 200S4 of the load lock 400. It is noted, however, that the openings 220A, 220B may be located on other walls of the load lock (see FIG. 5). Referring to FIGS. 5A and 5B, load lock 500 (which may also be substantially similar to load lock 400) includes three ports or openings 220A, 220B, 220C. The opening 220A may be formed through the first member 210 in wall 200S2 of the load lock 500. The opening 220B may be formed through the second member 211 in wall 200S4 of the load lock 500. The opening 220C may be formed by the first and second members 210, 211 through wall 200S1 of the load lock 500. In FIGS. 5A and 5B the first member 210 forms a first portion of the perimeter of the opening 220C while the second member 211 forms a second portion of the opening 220C. As may be realized the gate valves (such as valves 850 in FIGS. 7-9) and the load lock 400, 500 may be configured to allow at least the second member 211 to move away from the gate valve(s) 850 so that the second member 211 can be moved in the direction of arrow 260 relative to the first member 210 without substantially affecting alignment between other parts of the process tool 10 that are connected to the load lock 400, 500. As may also be realized, when the load lock 400, 500 is in a closed configuration (as shown in FIG. 5B), the gate valve(s) 850 and the second member 211 (and the first member 210) are configured in any suitable manner so that the gate valve(s) 850 form seals around respective ones of the openings 200A-200C.

FIG. 6A illustrates another load lock 600 in accordance with the aspects of the disclosed embodiment. Load lock 600 may also be substantially similar to load lock 400, however, instead of the opening 620B (substantially similar to opening 220B) being formed in the second member 211, the second member includes a relief area 211R and the opening 620B is formed in a protrusion 210P of the first member 210. As may be realized when the load lock 600 is in the closed position the side wall 200S4 of the load lock 600 is formed by sealed interaction between the protrusion 210P of the first member 210 and the portion of the second member adjacent the relief area 211R. The sealing member 225 is configured to form a seal between the sealing surfaces 210S, 211S of the first and second members 210, 211 as well as between sealing surfaces 610, 611, 612 of the second member 211 and sealing surfaces 613, 614, 615 of the first member 210 (e.g. the sealing surfaces around the protrusion 210P). As may be realized openings, such as opening 620C may also be located on the sides 200S1, 200S3 of the load lock 600' (FIG. 6B) in a manner substantially similar to that described above with respect to opening 620B such that the opening(s) 620C are formed in protrusions 210P2 located on the angled sealing surfaces of the first member 210. Forming the openings 620B, 620C in the respective protrusions 210P, 210P2 may allow, for example, the gate valves 850 (FIGS. 7-9) or any other suitable closure to be fixedly mounted to the sides of the load lock 600 substantially without disengaging a portion of the load lock 600 from the gate valve 850 for moving the second member 211 in the direction of arrow 260 for opening the load lock 600. It should be understood that the openings, such as in FIGS. 6A and 6B can be combined with each other and any one or more of the load lock configuration of FIGS. 2A-5B to form a load lock having any suitable combination of opening configurations as described herein.

Figure 7:
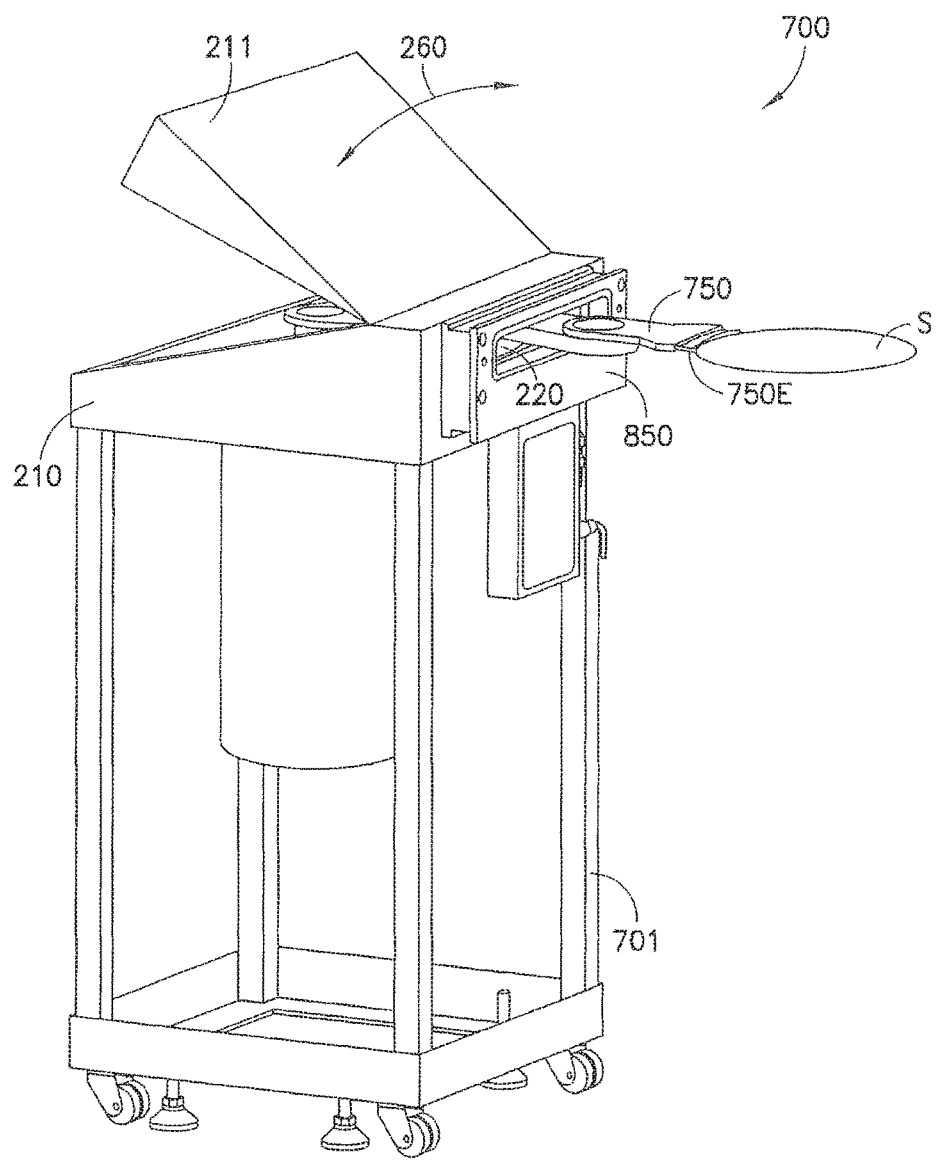
FIGS. 7-9 are schematic illustrations of process modules including transport apparatus in accordance with aspects of the disclosed embodiment.

FIG. 7 illustrates an example, of the aspects of the disclosed embodiment applied to a load lock including a transport robot 750. The load lock 700 may be substantially similar to one or more (or any combination of) the load locks in FIGS. 2A-6B but for the inclusion of the transport robot 750. The end effector 750E (which supports the workpiece S) of the transport robot 750 may be positioned within the load lock when the arm of the transport robot 750 is in a retracted configuration such that an operator can place the workpiece directly on the end effector 750E. The load lock may also include a buffer station (not shown, but see FIG. 1, reference A) configured to accept workpieces and from which the transport robot 750 picks (and places) workpieces for transfer to other modules in the process tool 10. Where a buffer station is located within the load lock the buffer station may be located such that when the load lock is in an open configuration as shown in FIG. 7, the operator has substantially unimpeded access to the buffer station for loading and unloading workpieces to and from the buffer station. In this example, the load lock is supported by frame 701 for positioning the load lock port(s) 220 at a height for connecting the load lock to other modules/portions of, for example, the processing tool 10 (FIG. 1). As can be seen in FIG. 7, a gate valve 850 or other suitable sealable door is attached to the load lock for selectively sealing the opening 220 for isolating the atmosphere within the load lock from other atmospheres of the processing tool 10.

Figure 8:
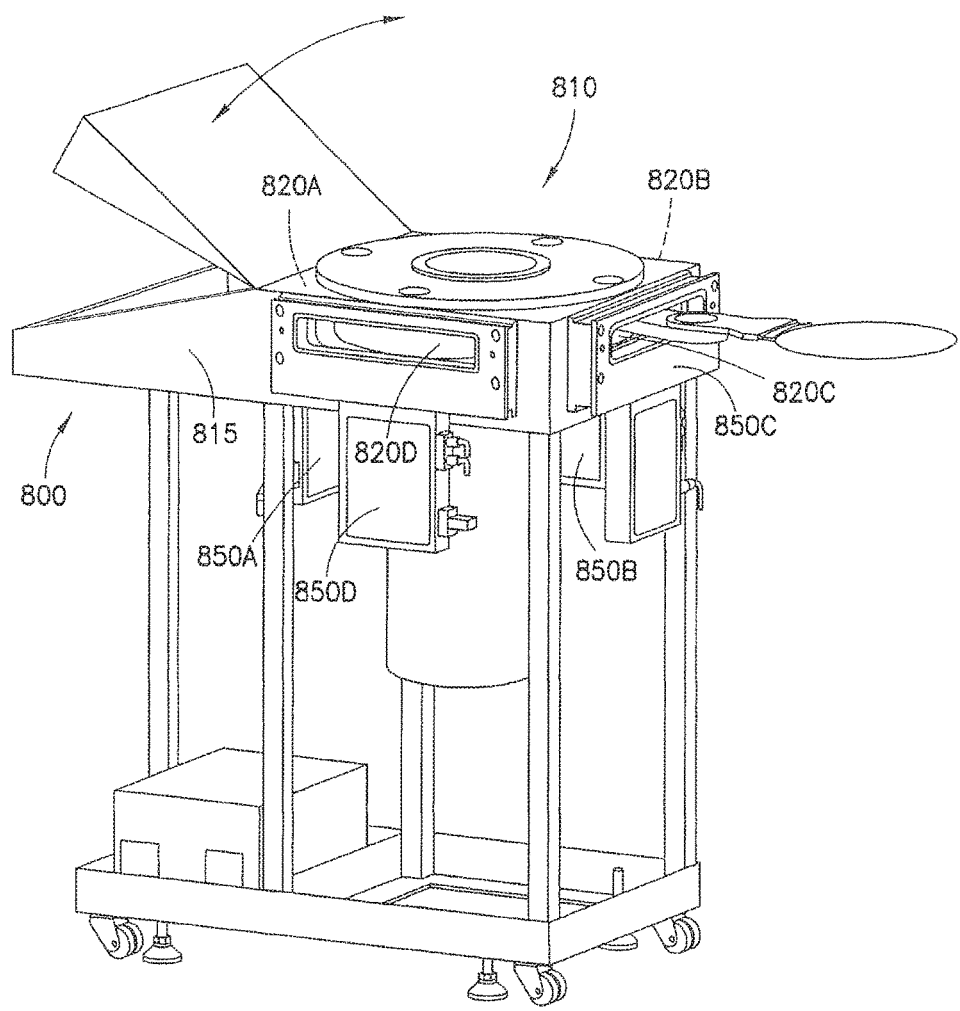
Figure 9:
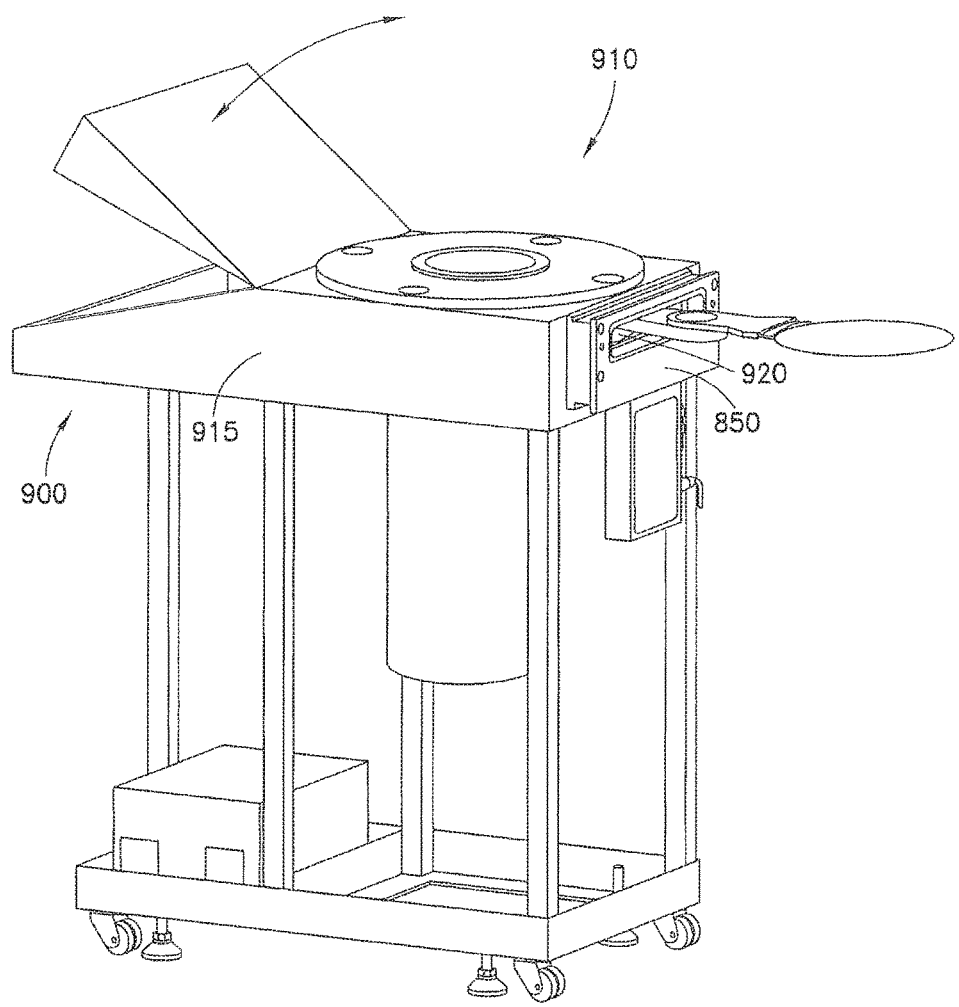

FIGS. 8 and 9 illustrate load lock 800, 900 which may be substantially similar to one or more (or any combination of) the load locks in FIGS. 2A-6B except the load locks 800, 900 are integrally formed with a respective transport chamber module 810, 910. The load lock 800 and integral transport chamber module 810 may include a housing or frame 815 having an internal chamber that includes a suitable partition between a load lock portion of the chamber and a transport chamber portion of the chamber. An opening or port 820A may be formed in the partition and a gate valve 850A may be mounted to the opening 820A (or form the opening, e.g. the gate valve is integral to the partition) for sealing the opening and isolating the load lock portion of the chamber from the transport chamber portion of the chamber. In the example, shown in FIG. 8 the transport chamber module includes three openings or ports 820B-820D and respective gate valves 850B-850D located on three sides of the transport chamber module such that any suitable process modules, load locks, and/or other transport chamber modules may be connected to the transport chamber module 810 through the gate valves 850B-850D.

In FIG. 9 the load lock 900 and integral transport chamber module 910 may include housing 915, which includes a chamber therein. In this example, the chamber within the housing 915 may include a load lock portion and a transport chamber portion, however, in this example, there is no gate valve for isolating the load lock portion from the transport chamber portion. The chamber within housing 915 is shared by the load lock and transport chamber module (e.g. the housing has a single common internal atmosphere). It should be understood that the load lock portion and a transport chamber portion can be isolated or otherwise sealed off from each other in any suitable manner such as in the manner described above with respect to FIG. 8. It is also noted that the housing 915 in FIG. 9 includes a single opening or port 920 and associated gate valve 850 but can include any suitable number of openings and associated gate valves.

FIG. 10 illustrates at least a portion of a process tool 1001 including a manual load lock 1000, a transport chamber module 1010 and a process module 1020. The load lock 1000 is connected to the transport chamber module 1010 through gate valve 850A. The transport chamber module 1010 is connected to the process module 1020 through gate valve 850B. As may be realized, other modules may be connected to the load lock 1000, transport chamber module 1010 and/or the process module 1020 and the configuration of the process tool is not limited to that shown in the Figure. The manual load lock 1000 may be substantially similar to one or more (or any combination of) the load locks in FIGS. 2A-9 described above. The transport chamber module 1010 may have a housing 1010H having a first member and second member 1011, 1012 which may be substantially similar to the first and second member of, for example, load locks 400, 500, 600. The transport chamber module may include a transport robot substantially similar to transport robot 20 (FIG. 1) described above for transporting workpieces between the load lock 1000 and the process module 1020. The process module 1020 may also have a housing 1020H with a first and second members 1021, 1022 substantially similar to the first and second members of load lock 200, 300. The process module may include any suitable process apparatus for processing workpieces as desired. As may also be realized, the different sections 1000, 1010, 1020 of the process tool 1001 (including the load locks described herein with respect to FIGS. 2A-9) may have any suitable atmospheric controls for maintaining a desired atmosphere (e.g. vacuum or otherwise) within the sealed chamber(s) of the process tool 1001. The manual load lock 1000 may be configured so that the second member 211 pivots in the direction of arrow 1040, relative to the first member 210 for opening the load lock 1000 to allow an operator to insert or remove workpieces to/from an interior chamber of the load lock. The second member 1012 of the transport chamber module 1010 may be configured to pivot in the direction of arrow 1041 (e.g. substantially in-line with a direction of travel WT of the workpieces through the processing tool) relative to the first member 1011 for allowing an operator access to an interior chamber of the transport chamber module 1010 for any desired purpose. The second member 1022 of the process module 1020 may be configured to pivot in the direction of arrow 1042 relative to the first member 1021 for allowing an operator access into an interior chamber of the process module 1020.

FIG. 11 illustrates at least a portion of a process tool 1101 including a manual load lock 1100, a transport chamber module 1110 and a process module 1120. The load lock 1100 is connected to the transport chamber module 1110 through gate valve 850A. The transport chamber module 1110 is connected to the process module 1120 through gate valve 850B. As may be realized, other modules may be connected to the load lock 1100, transport chamber module 1110 and/or the process module 1120 and the configuration of the process tool 1101 is not limited to that shown in the Figure. The manual load lock 1100 may be substantially similar to manual load lock 1000 described above with respect to FIG. 10. The transport chamber module 1110 may have a housing 1110H having a first member and second member 1111, 1112 which may be substantially similar to the first and second member of, for example, load locks 500, 600' such that the transport chamber module includes protrusions on the angled sealing/interface surfaces through which opening are provided for attaching the transport chamber module 1110 to the load lock 1100 and process module 1120 through the gate valves 850A, 850B. The transport chamber module may include a transport robot substantially similar to transport robot 20 (FIG. 1) described above for transporting workpieces between the load lock 1100 and the process module 1120. The process module 1020 may also have a housing 1120H with a first and second members 1121, 1122 substantially similar to the first and second members of load lock 200, 300. The process module may include any suitable process apparatus for processing workpieces as desired. As may also be realized, the different sections 1100, 1110, 1120 of the process tool 1001 may have any suitable atmospheric controls for maintaining a desired atmosphere (e.g. vacuum or otherwise) within the sealed chamber(s) of the process tool 1001. The manual load lock 1000 may be configured so that the second member 211 pivots in the direction of arrow 1140, relative to the first member 210 for opening the load lock 1100 to allow an operator to insert or remove workpieces to/from an interior chamber of the load lock. The second member 1112 of the transport chamber module 1110 may be configured to pivot in the direction of arrow 1141 (e.g. substantially transverse with a direction of travel WT of the workpieces through the processing tool) relative to the first member 1111 for allowing an operator access to an interior chamber of the transport chamber module 1110 for any desired purpose. The second member 1122 of the process module 1120 may be configured to pivot in the direction of arrow 1142 relative to the first member 1121 for allowing an operator access into an interior chamber of the process module 1120. As may be realized, the load lock 1100 and/or process module 1120 may be configured to open in a direction transverse to the direction of travel WT of workpieces through the process tool 1101. As may also be realized, the housings of any one of the load locks, transport chamber modules and process modules may be configured in a manner substantially similar to that described above with respect to load locks of FIGS. 2-9.

In a first aspect of the disclosed embodiment a workpiece handling module includes a first housing member; and a second housing member where the second member is pivotally movable relative to the first member; where the first housing member and second housing member form a housing having an access side and a second side opposite the access side, side walls, where a first portion of the side walls is carried by the first member and a second portion of the side walls is carried by the second member, and at least one of the first and second housing members includes at least one sealable opening formed therethrough for allowing ingress and egress of workpieces to and from an interior chamber formed by the first and second housing members when the first and second housing members are in a closed configuration, and wherein the second portion of the side walls adjacent the access side and carried by the second member is greater than the first portion of the side walls adjacent the access side and carried by the first member.

In accordance with a first sub-aspect of the first aspect of the disclosed embodiment, the side walls of the first and second housing members include substantially inclined interface surfaces that form a substantially inclined interface between the first and second housing members where the incline extends between the access side and the second side.

In accordance with the first sub-aspect of the first aspect of the disclosed embodiment, the substantially inclined interface surfaces of one or more of the first and second housing members includes a sealing member for sealing an atmosphere within the workpiece handling module.

In accordance with the first aspect of the disclosed embodiment, the first housing member includes at least one protrusion formed on the substantially inclined interface surfaces where an opening is formed in the at least one protrusion for allowing the ingress and egress of workpieces to and from an interior chamber of the workpiece handling module.

In accordance with the first aspect of the disclosed embodiment, an opening assist device is connected to the first and second members for reducing the amount of force required to pivot the second member relative to the first member for opening the workpiece handling module.

In accordance with the first aspect of the disclosed embodiment, the workpiece handling module is sealable when in a closed configuration so that a sealed controlled environment is maintained within a chamber of the workpiece handling module formed by the first and second housing members.

In accordance with a second sub-aspect of the first aspect of the disclosed embodiment, the workpiece handling module includes a load lock portion and a transport chamber portion integrally formed with the load lock portion.

In accordance with the second sub-aspect of the first aspect of the disclosed embodiment, the load lock portion is selectively sealable from the transport chamber portion for sealing an atmosphere within at least the transport chamber portion.

In accordance with the first aspect of the disclosed embodiment, the workpiece handling module is one of a manual load lock, transport chamber module or a process module.

In accordance with the first aspect of the disclosed embodiment, the workpiece handling module includes a workpiece transport robot disposed at least partially within one or more of the first housing member and the second housing member.

In accordance with a second aspect of the disclosed embodiment, a substrate processing tool includes a frame; and at least one workpiece handling module connected to the frame, the at least one workpiece handling module including a housing having a first member and a second member pivotally coupled to the first member in a clam shell configuration, and at least one of the first member and second member includes at least one sealable opening formed therethrough for allowing ingress and egress of workpieces to and from an interior chamber formed by the first member and second members when the clam shell configuration is closed, side walls, an access side, and a second side opposite the access side, where the clam shell configuration is configured to allow access to the interior chamber at the access side substantially unhindered by the side walls of the housing.

In accordance with the second aspect of the disclosed embodiment, a first portion of the side walls is carried by the first member and a second portion of the side walls is carried by the second member wherein the second portion of the side walls adjacent the access side and carried by the second member is greater than the first portion of the side walls adjacent the access side and carried by the first member.

In accordance with the second aspect of the disclosed embodiment, the substrate processing tool has a substantially linearly elongated arrangement.

In accordance with a first sub-aspect of the second aspect of the disclosed embodiment, the side walls of the first and second members include substantially inclined interface surfaces that form a substantially inclined interface between the first and second members where the incline extends between the access side and the second side.

In accordance with the first sub-aspect of the second aspect of the disclosed embodiment, the substantially inclined interface surfaces of one or more of the first and second members includes a sealing member for sealing an atmosphere within the workpiece handling module.

In accordance with the second aspect of the disclosed embodiment, the first member includes at least one protrusion formed on the substantially inclined interface surfaces where an opening is formed in the at least one protrusion or allowing ingress and egress of workpieces to and from an interior chamber of the workpiece handling module.

In accordance with the second aspect of the disclosed embodiment, an opening assist device is connected to the first and second members for reducing the amount of force required to pivot the second member relative to the first member for opening the workpiece handling module.

In accordance with a second sub-aspect of the second aspect of the disclosed embodiment, the workpiece handling module includes a load lock portion and a transport chamber portion integrally formed with the load lock portion.

In accordance with the second sub-aspect of the second aspect of the disclosed embodiment, the load lock portion is selectively sealable from the transport chamber portion for sealing an atmosphere within at least the transport chamber portion.

In accordance with the second aspect of the disclosed embodiment, the workpiece handling module is one of a manual load lock, transport chamber module or a process module.

It should be understood that the aspects of the disclosed embodiment described herein may be used individually or in any suitable combination thereof. It should also be understood that the foregoing description is only illustrative of the embodiments. Various alternatives and modifications can be devised by those skilled in the art without departing from the embodiments. Accordingly, the aspects of the disclosed embodiment are intended to embrace all such alternatives, modifications and variances that fall within the scope of the appended claims.

What is claimed is:

1. A substrate processing tool comprising:
   a frame; and
   at least one workpiece handling module connected to the frame, the at least one workpiece handling module including a housing having
      a first member and a second member pivotally coupled to the first member in a clam shell configuration, and at least one of the first member and second member includes at least one sealable opening formed therethrough for allowing ingress and egress of workpieces to and from an interior chamber formed by the first member and second member when the clam shell configuration is closed,
      side walls,
      an access side, and
      a second side opposite the access side,
      where the clam shell configuration is configured to effect workpiece ingress and egress access to and from the interior chamber through the access side, between a mating surface of respective portions of the side walls carried by the first member and a corresponding mating surface, that mates with the mating surface, of respective portions of the side walls carried by the second member and substantially unhindered by the side walls of the housing.

2. The substrate processing tool of claim 1, wherein a first portion of the side walls is carried by the first member and a second portion of the side walls is carried by the second member wherein the second portion of the side walls adjacent the access side and carried by the second member has a height that is greater than another height of the first portion of the side walls adjacent the access side and carried by the first member.

3. The substrate processing tool of claim 1, wherein the substrate processing tool has a substantially linearly elongated arrangement.

4. The substrate processing tool of claim 1, wherein the side walls of the first and second members include substantially inclined interface surfaces that form a substantially inclined interface between the first and second members where the incline extends between the access side and the second side.

5. The substrate processing tool of claim 4, wherein the substantially inclined interface surfaces of one or more of the first and second members includes a sealing member for sealing an atmosphere within the workpiece handling module.

6. The substrate processing tool of claim 1, wherein the first member includes at least one protrusion formed on the substantially inclined interface surfaces where one of the at least one sealable opening is formed in the at least one protrusion for allowing ingress and egress of workpieces to and from an interior chamber of the workpiece handling module.

7. The substrate processing tool of claim 1, further comprising an opening assist device connected to the first and second members for reducing the amount of force required to pivot the second member relative to the first member for opening the workpiece handling module.

8. The substrate processing tool of claim 1, wherein the workpiece handling module includes a load lock portion and a transport chamber portion integrally formed with the load lock portion.

9. The substrate processing tool of claim 8, wherein the load lock portion is selectively sealable from the transport chamber portion for sealing an atmosphere within at least the transport chamber portion.

10. The substrate processing tool of claim 1, wherein the workpiece handling module is a manual load lock.

11. The substrate processing tool of claim 1, wherein the workpiece handling module is a transport chamber module.

12. The substrate processing tool of claim 1, wherein the workpiece handling module is a process module.

13. A method for processing a workpiece comprising:
   providing a workpiece handling module including a housing having
      a first member and a second member pivotally coupled to the first member in a clam shell configuration and at least one of the first member and the second member includes a sealable opening formed therethrough for allowing ingress and egress of the workpiece to and from an interior chamber formed by the first member and the second member when the clam shell configuration is closed;
   at least one of placing workpieces to or removing workpieces from the workpiece handling module housing by way of a respective ingress and egress through the sealable opening of the workpiece handling module, wherein, the clam shell configuration of the workpiece handling module includes side walls, an access side, and a second side opposite the access side, where the clam shell configuration is configured to effect workpiece ingress and egress to and from the interior chamber through the access side, between a mating surface of respective portions of the side walls carried by the first member and a corresponding mating surface, that mates with the mating surface, of respective portions of the side walls carried by the second member and substantially unhindered by the side walls of the housing;

opening the workpiece handling module at the access side; and placing or removing at least one workpiece, of the workpieces, to and from the workpiece handling module housing by way of a respective ingress or egress through the access side.

14. The method of claim 13, further comprising:

manually placing the at least one workpiece into the open workpiece handling module housing through the access side; and effecting egress of the at least one workpiece through the sealable opening into another workpiece handling module.

15. The method of claim 13, further comprising:

effecting ingress of the at least one workpiece into the workpiece handling module housing through the sealable opening from another workpiece handling module; and manually removing the at least one workpiece from the open workpiece handling module housing through the access side.

16. A substrate processing tool comprising:

a frame;

at least one workpiece load lock module, connected to the frame, including a housing with at least one load lock sealable opening and a manual workpiece ingress and egress access to an interior of the housing of the at least one workpiece load lock module; and at least one workpiece handling module connected to the at least one load lock sealable opening, the at least one workpiece handling module including a housing having a first member and a second member pivotally coupled to the first member in a clam shell configuration, and at least one of the first member and second member includes at least one opening communicating with the at least one load lock sealable opening formed therethrough for allowing ingress and egress of workpieces to and from an interior chamber formed by the first member and second member when the clam shell configuration is closed, side walls, an access side, and a second side opposite the access side, where the clam shell configuration is configured to effect workpiece ingress and egress access to and from the interior chamber through the access side substantially unhindered by the side walls of the housing.

17. The substrate processing tool of claim 16, wherein a first portion of the side walls is carried by the first member and a second portion of the side walls is carried by the second member wherein the second portion of the side walls adjacent the access side and carried by the second member has a height that is greater than another height of the first portion of the side walls adjacent the access side and carried by the first member.

18. The substrate processing tool of claim 16, wherein the at least one load lock sealable opening is selectively sealable from the at least one workpiece handling module for sealing an atmosphere within the at least one workpiece handling module.

19. The substrate processing tool of claim 16, wherein the workpiece handling module is a transport chamber module.

20. The substrate processing tool of claim 16, wherein the workpiece handling module is a process module.

21. The substrate processing tool of claim 16, further comprising a workpiece transport module disposed to effect workpiece transfer from the at least one workpiece load lock module to the at least one workpiece handling module through the at least one load lock sealable opening.

* * * * *